United States Patent [19]

Mizuno et al.

[11] Patent Number: 4,659,639

[45] Date of Patent: Apr. 21, 1987

[54] PHOTOSENSITIVE MEMBER WITH AN AMORPHOUS SILICON-CONTAINING INSULATING LAYER

[75] Inventors: Hiroshi Mizuno, Ikoma; Shuji Iino, Itami; Izumi Osawa, Ikeda; Isao Doi, Toyonaka, all of Japan

[73] Assignee: Minolta Camera Kabushiki Kaisha, Osaka, Japan

[21] Appl. No.: 648,737

[22] Filed: Sep. 10, 1984

[30] Foreign Application Priority Data

Sep. 22, 1983 [JP] Japan .................................. 58-175818
Sep. 22, 1983 [JP] Japan .................................. 58-175819

[51] Int. Cl.[4] ........................................... G03G 5/082
[52] U.S. Cl. ........................................ 430/65; 430/67; 430/85
[58] Field of Search ..................... 430/58, 84, 85, 95, 430/67, 65

[56] References Cited

U.S. PATENT DOCUMENTS

| | | | |
|---|---|---|---|
| 4,394,425 | 7/1983 | Shimizu et al. | 430/65 |
| 4,409,308 | 11/1983 | Shimizu et al. | 430/60 |
| 4,414,319 | 11/1983 | Shirai et al. | 430/65 |
| 4,443,529 | 4/1984 | Kanbe et al. | 430/65 |
| 4,452,874 | 6/1984 | Ogawa et al. | 430/57 |
| 4,452,875 | 6/1984 | Ogawa et al. | 430/57 |
| 4,460,669 | 7/1984 | Ogawa et al. | 430/57 |
| 4,460,670 | 7/1984 | Ogawa et al. | 430/57 |
| 4,465,750 | 8/1984 | Ogawa et al. | 430/57 |
| 4,471,042 | 9/1984 | Komatsu et al. | 430/66 |
| 4,483,911 | 11/1984 | Ogawa et al. | 430/65 |
| 4,495,262 | 1/1985 | Matsuzaki et al. | 430/58 |
| 4,555,464 | 11/1985 | Kido et al. | 430/67 |

*Primary Examiner*—John L. Goodrow
*Attorney, Agent, or Firm*—Watson, Cole, Grindle & Watson

[57] ABSTRACT

A photosensitive member which comprises a photoconductive layer and an insulating layer located on the photoconductive layer, the photoconductive layer including amorphous silicon and the insulating layer including amorphous silicon, carbon, oxygen and fluorine. The photoconductive layer has a higher resistivity than the photosensitive member. A barrier layer may be located beneath the photoconductive layer, the barrier layer including either amorphous silicon, oxygen and a Group III impurity or amorphous silicon, carbon and oxygen.

12 Claims, 5 Drawing Figures

PHOTOSENSITIVE MEMBER WITH AN AMORPHOUS SILICON-CONTAINING INSULATING LAYER

BACKGROUND OF THE INVENTION

1. Field of the Invention

The present invention relates to a photosensitive member having a photoconductive layer which includes at least amorphous silicon.

2. Description of the Prior Art

Photosensitive members of various types have already been proposed. Among other things, attention has been focussed on the application to such photosensitive members of amorphous silicon (hereinafter abbreviated as "a-Si"), amorphous germanium (a-Ge) and amorphous silicon-germanium (a-Si:Ge) which are produced by processes such as glow discharge decomposition and sputtering. This is attributable to the fact that photosensitive members of a-Si, a-Ge and a-Si:Ge are much superior to those of selenium or CdS in heat resistance and abrasion resistance, and also from the viewpoint of environmental pollution.

However, photosensitive members comprising photoconductive layers of a-Si, a-Ge and a-Si:Ge have an insufficiently low dark resistance. Thus they dislay the drawback that they cannot be formed to have a charge retaining function as well. For this purpose, Published Unexamined Japanese Patent Application Sho No. 54-145539 proposes to include oxygen and/or nitrogen in the photoconductive layer of a-Si to improve the dark resistivity. However, this in turn deteriorates its photosensitivity, indicating that the amount of oxygen and/or nitrogen that can be included will inevitably have a limit.

In view of the above, there has been proposed in Published Unexamined Japanese Patent Application SHO No. 57-115551 a photosensitive member which comprises an a-Si photoconductive layer and an a-Si insulating layer formed on the photoconductive layer, the a-Si insulating layer containing a large amount of carbon. However, inclusion of carbon in such a photosensitive member will cause the electrophotographic characteristic to vary a great deal, depending on the amount of carbon. For example, when the amount of carbon included in the a-Si insulating layer is relatively small, the layer itself will not be sufficiently high in resistance; also, light fatigue of the layer becomes large and an image blur is caused under highly humid conditions. On the other hand, a large amount of carbon will improve the charge retaining capability and the light transparency of the insulating layer but in turn causes a reduction in the hardness of the layer. Additionally, white dot patterns appear on the image formed due to layer defects in highly humid conditions.

Moreover, when the a-Si photoconductive layer is directly formed on an electro-conductive substrate, patterns such as white dots and pin holes appear on the image obtained. This is attributable to defects in the a-Si photoconductive layer causing leakage of charge carriers. Such defects easily occur depending on the surface condition and contamination of the electro-conductive substrate. Further, charges are easily injected from the substrate, which deteriorate the dark decay characteristic, which in turn causes a reduction in charge retaining ability.

SUMMARY OF THE INVENTION

It is accordingly a primary object of the present invention to provide a photosensitive member which has a light transparent insulating layer formed on a photoconductive layer of an amorphous silicon and which is free of light fatigue and which has excellent electrophotographic characteristics.

Another object of the present invention is to provide a photosensitive member having a novel insulating layer formed on an amorphous silicon photoconductive layer which is free of light fatigue, which exhibits excellent electrophotographic characteristics inclusive of photosensitivity, charge retaining capability and surface hardness and which is capable of forming images of good quality over long periods of continuous copying under highly humid conditions.

Still another object of the present invention is to provide a photosensitive member which includes on an electroconductive substrate in the order of a novel barrier layer including amorphous silicon, an amorphous silicon photoconductive layer and a novel insulating layer and which has excellent electrophotographic characteristics free of light fatigue, high photosensitivity, high charge retaining ability and surface hardness and which is effective in preventing injection of charges from the substrate as well as in preventing residual potential to rise by continuous copyings.

These and other objects of the present invention can be achieved by providing a photosensitive member comprising an insulating layer which includes amorphous silicon, oxygen, carbon and fluorine and which is formed on a photoconductive layer including amorphous silicon. Additionally, a barrier layer which includes either amorphous silicon, oxygen and a Group IIIA impurity of the Periodic Table or amorphous silicon, oxygen and carbon may be formed between an electroconductive substrate and a photoconductive layer of amorphous silicon.

DETAILED DESCRIPTION OF THE INVENTION

Figure 1:
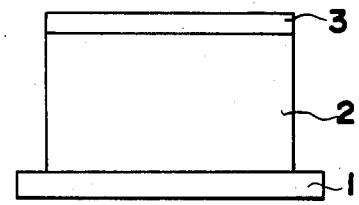
FIG. 1 illustrates the laminated construction of the photosensitive member according to first embodiment of the present invention.

FIG. 1 illustrates the construction of a photosensitive member in accordance with first embodiment of the invention wherein 1 is an electrically conductive substrate and 2 and 3 are respectively a photoconductive layer including at least a-Si and an insulating layer including a-Si, carbon, oxygen and fluorine as laminated in that order on the substrate 1.

The photoconductive layer 2 including a-Si to be formed on the substrate 1 is formed to a thickness of about 5 to 100 microns, preferably about 10 to 60 microns, by glow discharge decomposition or sputtering, for instance. As an example of forming the a-Si photoconductive layer, gases like $SiH_4$, $Si_2H_6$, $B_2H_6$ are fed into a pressure reducible reaction chamber with $H_2$ or Ar used as a carrier gas and the glow discharge is effected under application of high frequency power, thereby forming on the substrate the a-Si photoconductive layer including hydrogen and further boron, if necessary. $GeH_4$ gas may be concurrently fed to form an a-Si:Ge photoconductive layer. The photoconductive layer 2 formed in this way may have a dark resistance of low value, and in order to improve the dark resistance, an impurity of Group IIIA of the Periodic Table and a small amount of oxygen, carbon or nitrogen may be added. As an example as disclosed in U.S. Pat. No. 4,489,149, 10 to 40 atomic % of hydrogen, less than 0.05 atomic % of oxygen and 10 to 20,000 ppm of boron may be incorporated in the a-Si photoconductive layer to improve the dark resistance without sacrificing the photosensitivity.

The insulating layer 3 including a-Si is produced likewise on the photoconductive layer 2 to a thickness of about 0.01 to 3 microns by glow discharge decomposition or sputtering, for instance. This insulating layer 3 has a resistivity which is higher than that of the photoconductive layer 2 and its resistivity is either substantially uniform throughout the layer or gradually becomes higher toward its surface opposite the boundary with the photoconductive layer 2. Specially, the insulating layer 3 includes carbon, oxygen and fluorine in addition to the main constituent of a-Si or a-Si:Ge. By this, the resistivity of the insulating layer 3 is increased but also the electrophotographic characteristics of the photo-sensitive member such as surface hardness and photosensitivity are remarkably improved. Moreover, the photosensitive member as such is free of light fatigue and is superior from the view-point of environmental pollution. This is to say that the surface hardness of the insulating layer with only carbon included becomes gradually low with an increase of the amount of carbon so that the photosensitive member with such insulating layer is not suited for repetitive copying for a long period of time. Additionally, patterns of white dots appear on the image formed to cause image blur when only carbon is included in the insulating layer.

In the present invention, various drawbacks described above have been overcome by including oxygen and fluorine in addition to carbon in the insulating layer 3 of a-Si. Inclusion of oxygen and fluorine remarkably improves the light transparency of the insulating layer 3 and according to experiments described hereinbelow, the photosensitivity of the photosensitive member with the insulating layer containing about 1 atomic % of oxygen and 5 atomic % of fluorine in addition to 50 atomic % of carbon is quite higher than the one with only oxygen and carbon in the insulating layer. Also, no deterioration in the surface hardness of the insulating layer 3 was observed but rather improvement in the surface hardness was observed. Moreover, images of high quality can be obtained for a long run without causing image blur or white dot pattern even under highly humid or continuous copying conditions.

In particular, the inclusion of fluorine is quite effective in raising the resistivity as well as improving the light transparency and surface hardness of the insulating layer 3. Moreover, its inclusion is effective to suppress adhesion of water on the insulating layer, thereby providing water repellency to the layer 3.

The amounts of oxygen, carbon and fluorine included in the insulating layer 3 will differ for the case in which they are included uniformly throughout the layer and for the case in which they are included in a way that the amounts gradually increase in the direction of the thickness, i.e., toward the surface of the layer 3. In the case of including carbon, oxygen and fluorine uniformly in the insulating layer 3, it is preferable that the amount of carbon be about 5 to 65 atomic % relative to a-Si, a very small amount (such as 0.01 atomic %) to about 10 atomic % for the amount of oxygen relative to a-Si and a very small amount (0.01 atomic %) to about 10 atomic % for the amount of fluorine. The minimum amounts should be 5 atomic % for carbon and a very small amount of about 0.01 atomic % for oxygen and fluorine because the amounts therebelow will be insufficient to raise the resistivity of the insulating layer 3 and moreover, the light transparency is poor and, light fatigue becomes noticeable. The amount of carbon should be no more than about 65 atomic % and no more than 10 atomic % for oxygen and fluorine because the amounts exceeding will cause image blur as well as deterioration of the surface hardness of the layer 3. If the amount of fluorine exceeds 10 atomic %, the characteristics of the layer deteriorate with many defects in the layer and this causes to produce copy images with white dot patterns under humid condition.

The amount of carbon in the insulating layer 3 should be 5 to 65 atomic % as described above but about 40 to 65 atomic % is more preferable. If the amount of carbon is less than 40 atomic %, particularly less than 30 atomic %, the resistivity of the insulating layer will not be sufficiently high enough under some circumstances even with oxygen and fluorine included. Thus, if it is exposed to light of wavelength of 400 to 650 nm, the light will partially be absorbed by the insulating layer and this may cause a blur in images reproduced. However, carbon of more that 40 atomic % assures the insulation of the layer 3 and the light will be absorbed by the photoconductive layer. Accordingly, it is preferable that if the amount of carbon is less than 40 atomic % in the insulating layer, such photosensitive member, although useable in normal copier, should be used in a copier with an exposure source of longer wavelength of 650 nm or more as in a laser beam printer.

If carbon, oxygen and fluorine are included, with the amount of each varying in the direction of the thickness, the amount of each should gradually increase in the direction of the thickness of the insulating layer 3. In this case, about 1 to 65 atomic % of carbon, a very small amount (about 0.01 atomic %) to 25 atomic % of oxygen and a very small amount (0.01 atomic %) to 10 atomic % of fluorine can be included in the layer 3. There is no necessity to vary the amount of all three of carbon, oxygen and fluorine. Instead, it is possible to fix the amount of any one or two of the three constant with the remaining gradually increasing. For example, the amount of carbon can be fixed constant throughout the layer with the amounts of oxygen and fluorine gradually increased or vice versa. In the case of latter, i.e., in the case of the amounts of oxygen and fluorine constant with the carbon amount gradually increasing, the maximum amount of oxygen should be about 10 atomic %.

To form the insulating layer 3 by the glow discharge decomposition, $O_2$, $C_2H_4$ and $SiF_4$ gases are concurrently introduced with $SiH_4$ gas (further $GeH_4$ gas if necessary). If the insulating layer is to be formed with the resistivity substantially uniform throughout the layer, then the amounts of $O_2$, $C_2H_4$ and $SiF_4$ gases flowing are held constant relative to $SiH_4$ (and $GeH_4$) gas. On the other hand, the amount of either or all $O_2$, $C_2H_4$, and $SiF_4$ gases flowing should gradually be increased if the resistivity of the layer 3 is to have gradual increase in the thickness of the layer.

Figure 2:
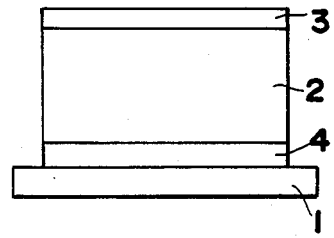
FIG. 2 illustrates the laminated construction of the photosensitive member according to second embodiment of the present invention.

Referring now to FIG. 2, which shows the second embodiment of the photosensitive member in accordance with the present invention, 4 is a barrier layer or an intermediate layer formed between the substrate 1 and the photoconductive layer 2. The photoconductive layer 2 and the insulating layer 3 are the same as the one described in connection with FIG. 1.

The barrier layer 4 includes, as in the first embodiment, a-Si (or a-Si:Ge), oxygen and an impurity of Group IIIA element of the Periodic Table, i.e., the barrier layer 4 is a-$SixO_{1-x}$ or (a-$SixO_{1-x})_yH_{1-y}$ with a Group IIIA impurity added. This barrier layer 4 is formed on the substrate 1 by glow discharge decomposition or sputtering to a thickness of about 0.003 to 2 microns, preferably 0.005 to 0.5 micron, and most preferably 0.01 to 0.2 micron. Oxygen is included in the barrier layer 4 in the amount of about 5 to 60 atomic % and this remarkably increases the resistivity of the layer 4 to prevent injection of charges from the substrate 1 effectively. Inclusion of oxygen is also effective on the leveling effect and coating characteristic of the barrier layer to the substrate. However, oxygen alone in a-Si or a-Si:Ge will cause residual potential to rise and because of this, the barrier layer 4 of the present invention further includes a Group IIIA impurity of the Periodic Table, preferably boron in the amount of less than about 2000 ppm, normally less than 200 ppm. Addition of boron allows charge carriers generated in the photoconductive layer 2 to move through the barrier layer 4 to the substrate 1 more easily and this effectively prevents a rise in residual potential.

The amount of oxygen included in the barrier layer 4 should be more than 5 atomic % as a lower amount is insufficient to improve the resistivity of the layer. The amount should not exceed 60 atomic % because the images become fogged and the residual potential is caused to rise even with boron included. As for boron, the amount thereof is no more than 2000 ppm, preferably 10 to 200 ppm, because the charge accepting ability of the photosensitive member becomes poor with an amount exceeding 2000 ppm.

The barrier layer 4 in the second form includes at least a-Si (or a-Si:Ge), carbon and oxygen and formed on the substrate 1 into a thickness same as the first form. This barrier layer 4 contains with respect to a-Si or a-Si:Ge about 5 to 60 atomic of carbon and a very small amount (0.01 atomic %) to about 10 atomic % of oxygen. The inclusion of carbon and oxygen not only remarkably increases the resistivity of the barrier layer 4 to effectively prevents injection of charges from the substrate 1, but is also effective on the leveling effect and the coating characteristic of the barrier layer to the substrate 1. Additionally, the inclusion of oxygen together with carbon allows movement of charge carriers generated in the photoconductive layer 2 to the substrate 1, thereby preventing a rise in residual potential.

The amount of carbon included in the carrier layer 4 should be more than 5 atomic % because a lower amount is insufficient to improve the resistivity of the layer 4. As for oxygen, the amount should not exceed 10 atomic % as the images obtained become fogged. In this connection the barrier layer 4 has a thickness of at least 0.003 micron and no more than 2 microns because a lesser thickness will be ineffective in preventing injection of charges from the substrate 1 and a greater thickness cannot prevent the residual potential from rising. A good result can be obtained with the thickness of 0.005 to 0.5 micron, and a best result at 0.01 to 0.2 micron.

The barrier layer 4 of the second form may further contain an impurity of Group IIIA element of the Periodic Table, preferably boron in an amount of less than 2000 ppm, preferably less than 200 ppm. Carbon together with oxygen enables charge carriers to move through the barrier layer but inclusion of the Group IIIA impurity in addition thereto further enhances the movement of charge carriers through the barrier layer so that a rise in the residual potential is effectively prevented. Boron can be included in the barrier layer 4 by concurrently feeding, for example, $B_2H_6$ gas with $SiH_4$ (and $GeH_4$ if necessary), $O_2$ and $C_2H_4$ gases into the pressure reducible chamber. Thereafter, the photoconductive layer 2 and the insulating layer 3 are formed on the barrier layer 4 to produce the photosensitive member shown in FIG. 2.

In forming the photosensitive members shown in FIGS. 1 and 2, i.e., in forming each of the layers 2, 3 and 4, hydrogenated silicon gases of Si and H atoms such as $SiH_4$, $Si_2H_6$, $Si_3H_8$ and $Si_4H_{10}$ may be used for including a-Si in each layer. When including carbon as in the barrier layer 4 and the insulating layer 3, saturated hydrocarbons with 1 to 5 carbons such as $CH_4$, $C_2H_6$, $C_3H_8$ and n-$C_4H_{10}$, hydrocarbons of ethylene series with 1 to 5 carbons such as $C_2H_4$, $C_3H_6$ and $C_4H_8$ and hydrocarbons of acetylene series such as $C_2H_2$, $C_3H_4$ and $C_4H_6$ may be used. For including oxygen, gases such as $O_2$, $O_3$, $CO$, $CO_2$, $NO$, $NO_2$, $N_2O$, $N_2O_3$, $N_2O_4$, $N_2O_5$ and $NO_3$ may be used. For fluorine, gases such as $HF$, $SiF_4$, $Si_2F_6$, $CF_4$ and $F_2$ may be used. Germanium may further be included in each of the layer and in this case, gases such as $GeH_4$ and $Ge_2H_6$ may be concurrently fed with hydrogenated silicon gas. In each layer, it is believed, particularly in the case of formation by the glow discharge decomposition, that hydrogen in the amount of about 10 to 40 atomic % is included as the gases such as $SiH_4$ and $B_2H_6$ are used.

In the following, a capacitive coupling type glow discharge decomposition apparatus for the production of the photosensitive member in accordance with the present invention is described.

Figure 3:
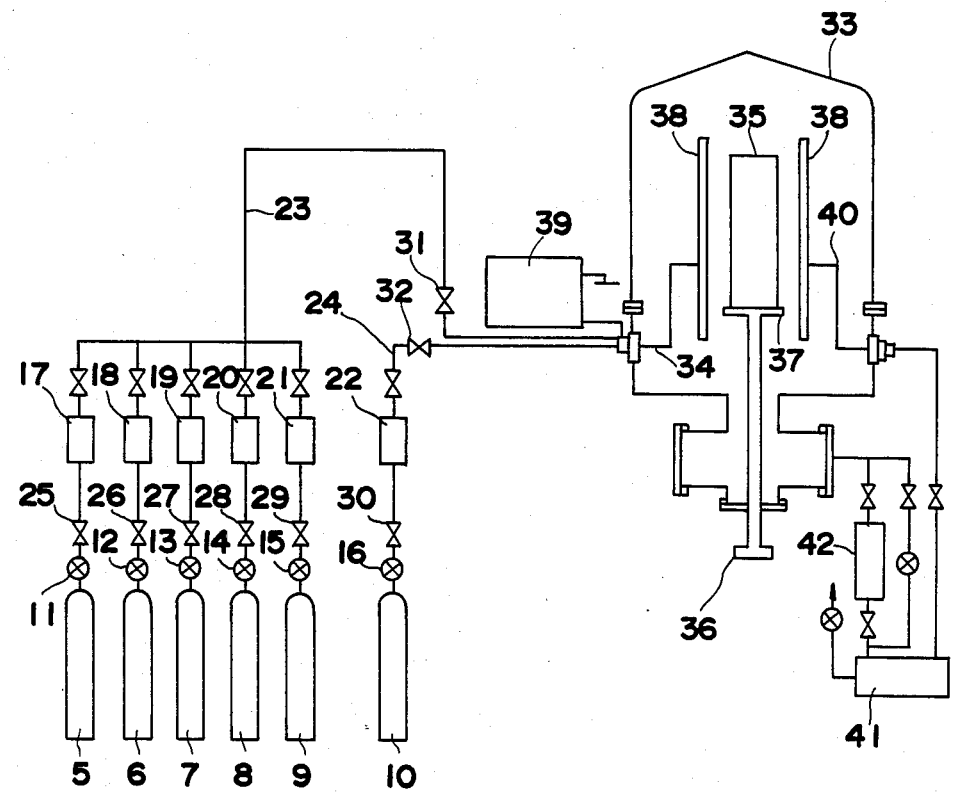
FIG. 3 illustrates a glow discharge decomposition apparatus for producing the photosensitive member according to the present invention.

In FIG. 3, a first, second, third, fourth, fifth and sixth tanks 5, 6, 7, 8, 9 and 10 contain $H_2$, $SiH_4$, $B_2H_6$, $C_2H_4$, $SiF_4$ and $O_2$ gases, respectively, in the leak-free state. $H_2$ gas in the first tank 5 is a carrier gas for $SiH_4$ and $H_2$ is used for $B_2H_6$ gas as well. Ar or He may also be used in place of hydrogen. A tank for $GeH_4$ gas is also necessary if any of the layer to be formed is to contain germanium. The above-mentioned gases are released by opening the corresponding first, second, third, fourth, fifth and sixth regulating valves 11, 12, 13, 14, 15 and 16 at the flow rates controlled by respective mass flow controllers 17, 18, 19, 20, 21 and 22. The gases from the first, second, third, fourth and fifth tanks 5, 6, 7, 8 and 9 are led to a first main pipe 23 and the $O_2$ gas from the sixth tank 10 is led to a second main pipe 24. The numerals 25, 26, 27, 28, 29, 30, 31 and 32 indicate check valves.

The gases flowing through the first and second main pipes 23 and 24 join in a third main pipe 34 disposed in a reaction chamber 33. In the reaction chamber 33, there is mounted a turntable 37 rotatable by means of a motor 36, and a substrate 35 of aluminum, stainless steel, NESA glass or the like on which a layer of a-Si is to be formed is disposed on said turbtable 37. The substrate 35 is electrically grounded and uniformly preheated by a suitable heating means to a temperature of about 100° to 400° C., preferably about 150° to 300° C. Surrounding the substrate 35 is a cylindrical electrode 38 which is electrically connected to a high frequency power source 39 and which is hollow inside and connected to the third main pipe 34 and fourth main pipe 40 on its outer wall portions. Although not shown, a plurality of gas discharging holes are formed on the inner wall area of the electrode 38 for discharging the gases fed from the third main pipe 34 onto the surface of the substrate 35. The gases discharged through the discharging holes are then absorbed through holes also formed on the inner wall and discharged out through the fourth main pipe 40. A high frequency power of about 0.05 to 1.5 kilowatts from the high frequency power source 39 is applied to the electrode 38 and a frequency of 1 to 50 $MH_z$ is suitable therefor. Moreover, because a high degree of vacuum (discharge pressure: 0.5 to 2 torr) is essential within the reaction chamber 33 for the formation of each of the layer shown in FIGS. 1 to 3, the chamber is connected with a rotary pump 41 and a diffusion pump 42.

If the photosensitive member shown in FIG. 1 is to be formed, an a-Si photoconductive layer 2 is first produced on the substrate 35(1). For this, the first and second regulating valves 11 and 12 are opened to release $H_2$ and $SiH_4$ gases from the first and second tanks 5 and 6 at a proper flow rate and if further necessary, oxygen gas from the sixth tank 10 by opening the sixth regulating valve 16 and/or $B_2H_6$ gas from the third tank 7 by opening the third regulating valve 13 are released. The amounts of gases released are controlled by mass flow controllers 17, 18, 19, 22 and the $SiH_4$ gas with $H_2$ as the carrier gas or a mixture of $SiH_4$ gas and $B_2H_6$ gas is fed through the first main pipe 23. At the same time, oxygen gas in a predetermined ratio to $SiH_4$ is fed through the second main pipe 24 and join with the gas from the first main pipe 23 in the third main pipe 34 to be fed to the electrode 38. With the gases discharged out uniformly from the discharging holes, a vacuum of about 0.05 to 2.0 torr is maintained in the reaction chamber 33, the substrate is maintained at 100° to 400° C., and the high frequency power to the electrode 38 is set at 0.05 to 1.5 kilowatts with the frequency at 1 to 50 $MH_z$. Under the above conditions, a glow discharge takes place to decompose the gases, whereby an a-Si photoconductive layer 2 containing at least hydrogen is formed on the substrate 35 at the speed of about 0.5 to 5 microns per hour.

When the desired thickness of the a-Si photoconductive layer 2 is formed, the glow discharge is either once discontinued or without discontinuing, an insulating layer 3 is formed. This is effected by releasing the gases from the first, second, fourth, fifth and sixth tanks 5, 6, 8, 9 and 10. If the insulating layer 3 is to have a uniform resistivity throughout the layer, then the flow amounts from each of the tank are maintained same such that the layer will be included with about 5 to 60 atomic % of carbon and a very small amount to 10 atomic % of oxygen and fluorine uniformly relative to a-Si. In another way of forming the insulating layer 3, the flow amount of any or all of $C_2H_4$, $O_2$ and $SiF_4$ are gradually increased during the formation of the insulating layer 3.

If the photosensitive members shown in FIG. 2 is to be formed, then the barrier layer 4 is first formed on the substrate 35 which is effected by feeding $H_2$, $SiH_4$, $B_2H_6$ and $O_2$ gases or $H_2$, $SiH_4$, $O_2$, $C_2H_4$ and $B_2H_6$ (only if necessary) gases simultaneously to the electrode 34.

EXPERIMENTAL EXAMPLE 1

Using the glow discharge decomposition apparatus shown in FIG. 3, the reaction chamber 33 was evacuated to $10^{-6}$ torr by means of the rotary pump 41 and diffusion pump 42. Followed thereby, the first to third and sixth regulating valves 11, 12, 13 and 16 are opened to release and flow $H_2$ gas from the first tank 5, $SiH_4$ gas diluted to 30% by $H_2$ from the second tank 6, $B_2H_6$ gas diluted to 200 ppm by $H_2$ from the third tank 7 and further $O_2$ gas from the sixth tank 10 into the mass flow controllers 17, 18, 19, 22 under a pressure gauge showing of 1 $kg/cm^2$. By adjusting the scales of respective mass flow controllers, the flow amounts were set to 274 sccm for $H_2$, 300 sccm for $SiH_4$, 25 sccm for $B_2H_6$ and 1.0 sccm for $O_2$ and fed into the reaction chamber 33. The pressure inside the chamber was then adjusted to 1.0 torr after the respective flow amounts have become stabilized. On the other hand, an aluminum drum of 120 mm in diameter was used as the substrate 35 and preheated to the temperature of 200° C.

With the flow amount of respective gases and the inner pressure of the chamber stabilized, a high frequency power of 300 watts (frequency of 13.56 $MH_z$) from the power source 39 was applied to the electrode 38 to generate glow discharge. This glow discharge was continued for about 7 hours to form an a-Si photoconductive layer 2 of about 20 microns thick on the substrate 35 and containing hydrogen, boron and a small amount of oxygen.

Upon formation of the a-Si photoconductive layer, the application of power from the high frequency power source 39 was suspended while the flow amounts of mass flow controllers were set to zero and the chamber evacuated. Thereafter, 400 sccm of $H_2$ gas from the first tank 5, 150 sccm of $SiH_4$ gas diluted to 30% by $H_2$ from the second tank 6, 90 sccm of $C_2H_4$ gas from the fourth tank 8, and 1 sccm of $O_2$ gas from the sixth tank 10 were introduced into the reaction chamber 33 and the power of 300 watts from the power source 39 was applied with the inner pressure adjusted to 1.0 torr. The glow discharge was continued for 3 minutes and while still continuing, $SiF_4$ gas from the fifth tank 9 was released while gradually raising a scale of the mass flow controller 21 such that the amount of flow of $SiF_4$ gas varies evenly to maximum of 45 sccm in 3 minutes thereby forming a layer with F content increasing in the thickness direction. When the flow amount of 45 sccm is reached, the glow discharge was further continued for 3 minutes with the above gases still being fed. As the result, the insulating layer 3 of about 0.1 micron thick was formed on the photoconductive layer 2. This insulating layer contained about 40 atomic of carbon, 1 atomic % of oxygen and about 5 atomic % of fluorine in the vicinity of the surface of the insulating layer.

The photosensitive member thus obtained was placed in an EP-520 toner image transfer type copying machine made by Minolta Camera K.K. for copying. The copies obtained had excellent contrast, high density and good continuous tone. 20,000 copies were made. The quality of the copies did not deteriorate even towards the end. Copying under the conditions of high temperature of 30° C. and high humidity of 80% revealed no change in the electrophotographic characteristics or as in copy qualities as compared with copies made under normal conditions.

The above photosensitive member was charged and exposed to a white light at the beginning and end of 200,000 copies for measuring the residual potentials. The results showed the residual potential of 0 V at the beginning and only several tens volts at the end.

EXPERIMENTAL EXAMPLE 2

Under the same conditions as in Experimental Example 1 except for changing the flow amount of $C_2H_4$ gas from the fourth tank 8 during the formation of the insulating layer 3, the photosensitive member with the photoconductive layer 2 on the substrate 35 and the insulating layer 3 on the photoconductive layer which contains about 50 atomic % of carbon, 1 atomic % of oxygen and about 5 atomic % of fluorine in the vicinity of the surface of the layer was prepared.

This photosensitive member was set in the noted EP-520 copying machine for continuous copying of 20,000 copies. The copies obtained were quite satisfactory and no deterioration in copy quality was observed from the beginning to the end.

EXPERIMENTAL EXAMPLE 3

Under the same conditions as in Experimental Example 1 except for setting the flow amount of $SiF_4$ gas to maximum of 30 sccm such that the flow amount of $SiF_4$ varies evenly to maximum of 30 sccm in 3 minutes during the formation of the insulating layer 3, the photosensitive member of the same construction and constituents as with Example 1 but containing only 3 atomic % of fluorine in the vicinity of the surface of the insulating layer 3 in addition to 40 atomic of carbon and 1 atomic % of oxygen was formed.

Placing this photosensitive member in the EP-520 copying machine for copying, the copies of excellent contrast of good continuous tone were obtained.

EXPERIMENTAL EXAMPLE 4

Under the same conditions as in Experimental Example 1 except for changing the flow amount of oxygen from the sixth tank 10 to 5 sccm during the formation of the insulating layer 3, the photosensitive member same as the one prepared in Example 1 but containing about 5 atomic % of oxygen in the insulating layer in addition to 40 atomic % of carbon and 5 atomic % of fluorine in the vicinity of the surface was obtained.

Subjecting this photosensitive member to copying operation by the EP-520 copying machine, copies of high contrast and density were obtained although the measurement of residual potential showed a somewhat high result after continuous copying of 20,000 copies.

EXPERIMENTAL EXAMPLE 5

Under the same conditions as in Experimental Example 1, a photoconductive layer 2 of about 20 micron thick was formed on the substrate 35. After the formation of the photoconductive layer, 400 sccm of $H_2$ gas from the first tank 5, 150 sccm of $SiH_4$ gas diluted to 30% by the $H_2$ from the second tank 6, 90 sccm of $C_2H_4$ gas from the fourth tank 8, 45 sccm of $SiF_4$ gas from the fifth tank 9 and 1 sccm of $O_2$ gas from the sixth tank 10 were introduced into reaction chamber 33 and the power of 300 watts from the power source 39 was applied with the inner pressure adjusted to 1.0 torr. The glow discharge was continued for 9 minutes and the insulating layer 3 of 0.1 micron thick which contains about 40 atomic of carbon, 1 atomic % of oxygen and 5 atomic % of fluorine uniformly throughout the layer was formed.

This photosensitive member was set in the EP-520 for 20,000 continuous copying and copies of good contrast and high density were obtained from the beginning to the end. The residual potential measured at the end of continuous copying was about 20 V higher than the residual potential of Example 1.

COMPARATIVE EXAMPLE 1

Under the same conditions as in Experimental Example 1 except for changing the flow amount of $SiF_4$ to maximum of 90 sccm such that the flow amount of $SiF_4$ gas varies evenly to maximum of 90 sccm in 3 minutes and held at its maximum flow amount for another 3 minutes during the formation of the insulating layer, the photosensitive member same as the one prepared in Experimental Example 1 but containing more than 10 atomic of fluorine was formed. With this photosensitive member set in the EP-520 copying machine for 20,000 continuous copying, the images began to blur after several thousand copies.

EXPERIMENTAL EXAMPLE 6

In this example, the photosensitive member shown in FIG. 2 was formed.

Using the glow discharge decomposition apparatus shown in FIG. 3, the reaction chamber 33 was evacuated to $10^{-6}$ torr by means of the rotary pump 41 and diffusion pump 42. Followed thereby, the first to third and sixth regulating valves 11, 12, 13 and 16 are opened to release and flow $H_2$ gas from the first tank 5, $SiH_4$ gas diluted to 30% by $H_2$ from the second tank 6, $B_2H_6$ gas diluted to 200 ppm by $H_2$ from the third tank 7 and further $O_2$ gas from the sixth tank 10 into the mass flow controllers 17, 18, 19, 22 under a pressure gauge showing of 1 kg/cm$^2$. By adjusting the scales of respective mass flow controllers, the flow amounts were set to 383 sccm for $H_2$, 150 sccm for $SiH_4$, 22.5 sccm for $B_2H_6$ and 45 sccm for $O_2$ and fed into the reaction chamber 33. The pressure inside the chamber was then adjusted to 1.0 torr after the respective flow amounts have become stabilized. On the other hand, an aluminum drum of 120 mm in diameter was used as the substrate 35 and preheated to the temperature of 200° C.

With the flow amount of respective gases and the inner pressure of the chamber stabilized, a high frequency power of 300 watts (frequency of 13.56 MH$_z$) from the power source 39 was applied to the electrode 38 to generate glow discharge. This glow discharge was continued for 3 minutes to form a barrier layer 4 of a-Si of about 0.1 micron thick and containing about 200 ppm of boron and 25 atomic % of oxygen.

Upon formation of the a-Si barrier layer, the application of power from the high frequency power source 39 was suspended while the flow amounts of mass flow controllers were set to zero and the chamber evacuated. Thereafter, the first, second, third and sixth regulating valves 11, 12, 13 and 16 were released to introduce $H_2$, $SiH_4$, $B_2H_6$ and $O_2$ gases into the mass flow controllers 17, 18, 19 and 22. Adjusting the scale of each of the mass flow controllers, 274 sccm of $H_2$, 300 sccm of $SiH_4$, 25 sccm of $B_2H_6$ and 1 sccm of $O_2$ gases were introduced into the reaction chamber 33 and by applying the power of 300 watts to the electrode 38, the glow discharge was generated. This glow discharge was continued for 7 hours to form an a-Si photoconductive layer of about 20 micron thick on the barrier layer and which contains hydrogen, boron and a small amount of oxygen.

Followed thereby, an insulating layer was formed as Similarly with Experimental Example 1. That is, 400 sccm of $H_2$ gas from the first tank 5, 150 sccm of $SiH_4$ gas diluted to 30% by $H_2$ from the second tank 6, 90 sccm of $C_2H_4$ gas from the fourth tank 8, and 1 sccm of $O_2$ gas from the sixth tank 10 were introduced into the reaction chamber 33 and the power of 300 watts from the power source 39 was applied with the inner pressure adjusted to 1.0 torr. The glow discharge was continued for 3 minutes and while still continuing, $SiF_4$ gas from the fifth tank 9 was released while gradually raising a scale of the mass flow controller 21 such that the amount of flow of $SiF_4$ gas varies evenly to maximum of 45 sccm in 3 minutes thereby forming a layer with F content increasing in the thickness direction. When the flow amount of 45 sccm is reached, the glow discharge was further continued for 3 minutes with the above gases still being fed. As the result, the insulating layer 3 of about 0.1 micron thick was formed on the photoconductive layer 2. This insulating layer contained about 40 atomic of carbon, 1 atomic % of oxygen and about 5 atomic % of fluorine in the vicinity of the surface of the insulating layer.

Using this photosensitive member in the EP-520 copying machine, 200,000 copies were formed continuously. The copies obtained had excellent contrast and good continuous tone. The qualities of the copies were substantially the same from the beginning to the end. Copying under the conditions of high temperature of 30° C. and high humidity of 80% revealed no change in the electrophotographic characteristics as well as in copy qualities as compared with the copies obtained under normal conditions.

The above photosensitive member was charged and exposed to a white light at the beginning and end of 200,000 copies for measuring the residual potentials. The results showed the residual potential of 0 V at the beginning and only few tens volts at the end.

EXPERIMENTAL EXAMPLE 7

Under the same conditions as in Experimental Example 6 except for changing the flow amount of $C_2H_4$ gas from the fourth tank 8 during the formation of the insulating layer 3, the photosensitive member same as the one prepared in Experimental Example 6 but containing about 50 atomic % of carbon in the insulating layer in addition to 1 atomic % of oxygen and 5 atomic % of fluorine in the surface vicinity was formed.

This photosensitive member was set in said EP-520 copying machine for continuous copying of 20,000 copies. The copies obtained were quite satisfactory and no deterioration in copy quality was observed from the beginning to the end.

EXPERIMENTAL EXAMPLE 8

Under the same conditions as in Experimental Example 6 except for setting the flow amount of $SiF_4$ gas to maximum of 30 sccm such that the flow amount of $SiF_4$ varies evenly to maximum of 30 sccm in 3 minutes during the formation of the insulating layer 3, the photosensitive member of the same construction and constituents as with Example 6 but containing only 3 atomic % of fluorine in the vicinity of the surface of the insulating layer 3 in addition to 40 atomic of carbon and 1 atomic % of oxygen was formed.

Placing this photosensitive member in the EP-520 copying machine for copying, copies of excellent contrast of good continuous tone were obtained.

EXPERIMENTAL EXAMPLE 9

Under the same conditions as in Experimental Example 6 except for changing the flow amount of oxygen from the sixth tank 10 to 5 sccm during the formation of the insulating layer 3, the photosensitive member same as the one prepared in Example 6 but containing about 5 atomic % of oxygen in the insulating layer in addition to 40 atomic % of carbon and 5 atomic % of fluoring in the vicinity of the surface was obtained.

Subjecting this photosensitive member to a copying operation by the EP-520 copying machine, copies of high contrast and density were obtained although the measurement of residual potential showed a somewhat high result after continuous copying of 20,000 copies.

EXPERIMENTAL EXAMPLE 10

Under the same conditions as in Experimental Example 6, the barrier layer 4 and the photoconductive layer 2 were sequentially formed. Followed thereby 400 sccm of $H_2$ gas from the first tank 5, 150 sccm of $SiH_4$ gas diluted to 30% by $H_2$ from the second tank 6, 90 sccm of $C_2H_4$ gas from the fourth tank 8, 45 sccm of $SiF_4$ gas from the fifth tank 9 and 1 sccm of $O_2$ gas from the sixth tank 10 were introduced into reaction chamber 33 and the power of 300 watts from the power source 39 was applied with the inner pressure adjusted to 1.0 torr. The glow discharge was continued for 9 minutes and the insulating layer 3 of 0.1 micron thick which contains about 40 atomic of carbon, 1 atomic % of oxygen and 5 atomic % of fluorine uniformly throughout the layer was formed.

This photosensitive member was set in the EP-520 for 20,000 continuous copying and the copies of good contrast and high density were obtained from the beginning to the end. The residual potential measured at the end of continuous copying was about 10 V higher than the residual potential of Example 6.

COMPARATIVE EXAMPLE 2

Under the same conditions as in Experimental Example 6 except for a change in the flow amount of $SiF_4$ to maximum of 90 sccm such that the flow amount of $SiF_4$ gas varies evenly to maximum of 90 sccm in 3 minutes and held at its maximum flow amount for another 3 minutes during the formation of the insulating layer, a photosensitive member the same as the one prepared in Experimental Example 1 but containing more than 10 atomic of fluorine was formed. With this photosensitive member set in the EP-520 copying machine for 20,000 continuous copying, the images began to blur after several thousand copies.

COMPARATIVE EXAMPLE 3

Under the same conditions as in Experimental Example 6 except for changing the flow amount of $O_2$ gas to 30 sccm during the formation of the insulating layer, the photosensitive member with the insulating layer containing about 30 atomic % of oxygen, 40 atomic % of carbon and 5 atomic % of fluorine in the surface vicinity was formed.

When this photosensitive member was set in the EP-520 copying machine for successive copying, the images began to blur even under the condition of normal temperature and humidity and as the copying were continued, blur in images became more noticeable.

COMPARATIVE EXAMPLE 4

Under the same conditions as in Experimental Example 7 but without flowing any SiF4 gas from the fifth tank, the photosensitive member with the insulating layer which contains 50 atomic % of carbon and 1 atomic % of oxygen but without any fluorine was prepared.

Figure 4:
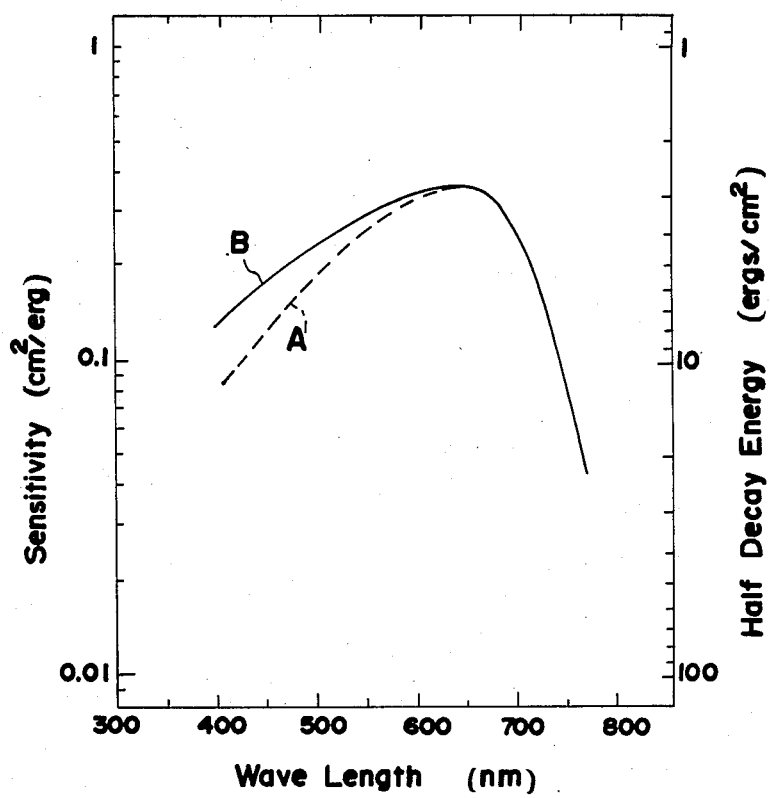
FIG. 4 is a graph showing the spectral sensitivity of the photosensitive member.

FIG. 4 shows the spectral sensitivities of this photosensitive member (curve A) as well as the one prepared in Experimental Example 7 (curve B). As apparent from this result, the photosensitive member of the type shown in FIG. 2 and which contains fluorine in the insulating layer has higher sensitivity particularly in the range of 400 to 600 nm than the one without any fluorine. When the photosensitive member prepared in this example was set in the EP-520 for 20,000 continuous copying, the copies were fairly satisfactory but white stripes began to appear on the copies. Since no such white stripes were observed in Experimental Example 7, it is believed that fluorine is effective to improve the surface hardness of the photosensitive member.

EXPERIMENTAL EXAMPLE 11

Under the same conditions as in Experimental Example 6 but feeding and introducing into the reaction chamber 33 245 sccm of H2 gas from the first tank 5, 300 sccm of SiH4 gas from the second tank 6, 90 sccm of C2H4 gas from the fourth tank 8 and 10 sccm of O2 gas from the sixth tank 10 for the formation of the barrier layer 4 and the glow discharge was generated to form the barrier layer of 0.1 micron thick which contains a-Si, about 40 atomic % of carbon and 5 atomic % of oxygen. Thereafter, a photoconductive layer and an insulating layer the same as Experimental Example 6 were formed sequentially on the barrier layer.

When this photosensitive member was subjected to 200,000 continuous copying operations, copies of excellent contrast and free of fog were obtained from the beginning to the end. Also, the increase of residual potential was quite small.

EXPERIMENTAL EXAMPLE 12

Under the same conditions as in Experimental Example 11 but further feeding 45 sccm of B2H6 gas from the third tank 7 during the formation of the barrier layer, the photosensitive member same as the one prepared in Experimental Example 11 but further containing 200 ppm of boron in the barrier layer in addition to 40 atomic % of carbon and 5 atomic % of oxygen was formed.

The copies obtained by 200,000 continuous copying operations had excellent contrast, high density and free of fog from the first to the last copy.

EXPERIMENTAL EXAMPLE 13

Under the same conditions as in Experimental Example 7 except for changing the flow amount of O2 gas during the formation of the barrier layer, the photosensitive member with the barrier layer containing 5 atomic % of oxygen and 200 ppm of boron to a-Si was formed. This photosensitive member produced copies free of fog and of good quality. Also, the residual potential remained low even after continuous copying.

COMPARATIVE EXAMPLE 5

Under the same conditions as in Experimental Example 11 except for setting the flow amount of O2 gas from the sixth tank 10 to 50 sccm during the formation of the barrier layer 4, the photosensitive member of the same construction but containing about 25 atomic % of oxygen in addition to 40 atomic % of carbon and 200 ppm of boron in the barrier layer was formed. This photosensitive member was set in an EP-520 for continuous copying. However, images began to fog from several thousandth copy and became more noticeable as copyings were continued. Also the rise of residual potential was quite high.

COMPARATIVE EXAMPLE 6

Figure 5:
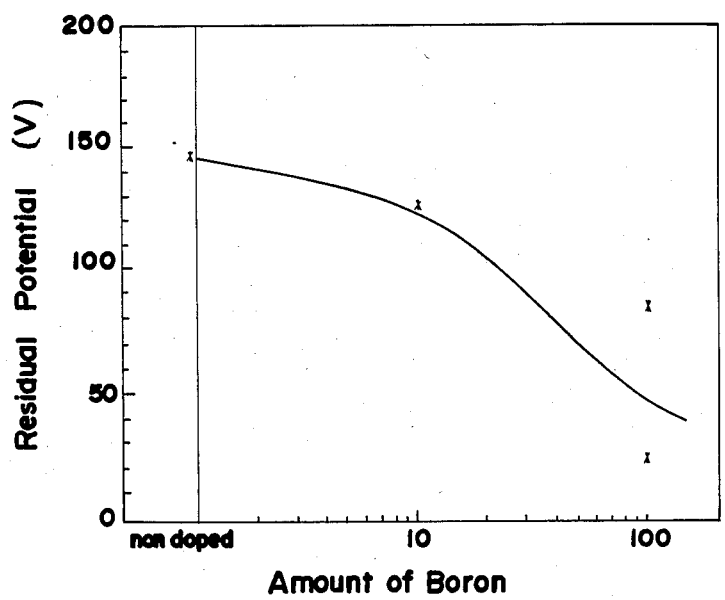
FIG. 5 is a graph showing the relationship between residual potential and amount of boron in the barrier layer of the photosensitive member.

Under the same conditions as in Experimental Example 7 except for inhibiting the flow of B2H6 gas from the third tank 7 during the formation of the barrier layer 4, the photosensitive member of the same construction but containing only a-Si, hydrogen and 25 atomic % of oxygen in the barrier layer 4 was formed. This photosensitive member when set in EP-520 for continuous copying of 50,000 copies reproduced fogged images from several thousandth copy and fogging of images became more noticeable as copying operation was continued. This is attributable to increase of the residual potential and has close relationship with the amount of boron in the barrier layer 4 as shown in FIG. 5. As apparent from FIG. 5, the residual potential decreases with the increase of amount of boron in the barrier layer 4. However, the increase of boron in turn causes gradual decrease of surface potential, i.e., charge accepting capability of the photosensitive member.

For this reason, it is preferable that the amount of boron be no more than 200 ppm at best but may be included up to 2000 ppm without causing a noticeable decrease in the charge accepting capability.

EXPERIMENTAL EXAMINE 14

Under the same conditions as in Experimental Example 7 except for varying the flow amount of B2H6 gas from the third tank 7 during the formation of the barrier layer 4, the photosensitive members of the same construction but respectively containing 100 ppm, 1000 ppm and 1800 ppm of boron in the barrier layers in addition to 25 atomic % of oxygen were formed.

Each of these photosensitive members reproduced images of good quality and even with those photosensitive members containing 1000 and 1800 ppm of boron, only a small decrease in the surface potential was observed.

Numerous modifications and variations of the present invention are possible in the light of the above teachings and, therefore, within the scope of the appended claims, the invention may be practiced otherwise than as particularly described.

What is claimed is:

1. A photosensitive member which comprises a photoconductive layer that includes amorphous silicon, and an insulating layer on said photoconductive layer, said insulating layer including amorphous silicon, carbon, oxygen and fluorine, said insulating layer having a thickness of about 0.01 to 3 microns.

2. A photosensitive member which comprises a photoconductive layer that includes amorphous silicon and has a thickness of 5 to 100 microns, and an insulating layer on said photoconductive layer which includes amorphous silicon, carbon, oxygen and fluorine, and which has a thickness of about 0.01 to 3 microns, said insulating layer including about 5 to 65 atomic % of carbon, up to 10 atomic % of oxygen and up to 10 atomic % of fluorine.

3. A photosensitive member as claimed in claim 2, wherein said carbon, oxygen and fluorine are included uniformly throughout said insulating layer.

4. A photosensitive member as claimed in claim 2, further including an electroconductive substrate and a barrier layer on said electroconductive substrate, said photoconductive layer being located on said barrier layer, said barrier layer including amorphous silicon, about 5 to 60 atomic % of oxygen and a Group IIIA impurity of the Periodic Table, said barrier layer having a thickness of about 0.003 to 2 microns.

5. A photosensitive member as claimed in claim 2, further including an electroconductive substrate and a barrier layer on said electroconductive substrate, said photoconductive layer being located on said barrier layer, said barrier layer including amorphous silicon, about 5 to 60 atomic % of carbon and up to 10 atomic % of oxygen, said barrier layer having a thickness of about 0.003 to 2 microns.

6. A photosensitive member which comprises a photoconductive layer that includes amorphous silicon and has a thickness of 5 to 100 microns, and an insulating layer on said photoconductive layer which includes amorphous silicon, carbon, oxygen and fluorine, and which has a thickness of about 0.01 to 3 microns, said insulating layer including about 1 to 65 atomic % of carbon, up to 25 atomic % of oxygen and up to 10 atomic % of fluorine varying within said insulating layer in the direction away from said photoconductive layer.

7. A photosensitive member which comprises:
an electrically-conductive substrate;
a barrier layer on said substrate, said barrier layer including either amorphous silicon, about 5 to 60 atomic % of oxygen and no more than 2000 ppm of a Group IIIA impurity of the Periodic Table, or amorphous silicon, about 5 to 60 atomic % of carbon and no more than 10 atomic % of oxygen, said barrier layer having a thickness of about 0.003 to 2 microns;
a photoconductive layer, said photoconductive layer including amorphous silicon and having a thickness of 5 to 100 microns; and
an insulating layer on said photoconductive layer, said insulating layer including amorphous silicon, carbon, oxygen and fluorine, and which has a thickness of about 0.01 to 3 microns, said insulating layer including about 5 to 65 atomic % of carbon, up to 10 atomic % of oxygen and up to 10 atomic % of fluorine.

8. A photosensitive member which comprises:
an electrically-conductive substrate;
a barrier layer on said substrate, said barrier layer including either amorphous silicon, about 5 to 60 atomic % of oxygen and up to 2000 ppm of a Group IIIA impurity of the Periodic Table, or amorphous silicon, about 5 to 60 atomic % of carbon and up to 10 atomic % of oxygen, said barrier layer having a thickness of about 0.003 to 2 microns;
a photoconductive layer, said photoconductive layer including amorphous silicon and having a thickness of 5 to 100 microns; and
an insulating layer on said photoconductive layer, said insulating layer including amorphous silicon, carbon, oxygen and fluorine, and which has a thickness of about 0.01 to 3 microns, said insulating layer including about 1 to 65 atomic % of carbon, up to 25 atomic % of oxygen and up to 10 atomic % of fluorine, the concentration of at least one of said carbon, oxygen and fluorine varying within said insulating layer in the direction away from said photoconductive layer.

9. A photosensitive member as claimed in claim 2, wherein said insulating layer includes between about 0.01 atomic % and 10 atomic % of oxygen and between about 0.01 atomic % and 10 atomic % of fluorine.

10. A photosensitive member as claimed in claim 6, wherein said insulating layer includes at least 0.01 atomic % of oxygen and at least 0.01 atomic % of fluorine.

11. A photosensitive member as claimed in claim 7, wherein said insulating layer includes at least 0.01 atomic % of oxygen and at least 0.01 atomic % of fluorine.

12. A photosensitive member as claimed in claim 8, wherein said insulating layer includes at least 0.01 atomic % of oxygen and at least 0.01 atomic % of fluorine.

* * * * *